(12) United States Patent
Neusser et al.

(10) Patent No.: US 12,477,710 B2
(45) Date of Patent: Nov. 18, 2025

(54) SUPPORT PIN FOR SUPPORTING A SUBSTRATE IN A PLACEMENT AREA OF A PLACEMENT MACHINE

(71) Applicant: ASMPT GmbH & Co. KG, Munich (DE)

(72) Inventors: Martin Neusser, Munich (DE); Jetulla Avdili, Munich (DE)

(73) Assignee: ASMPT GmbH & Co. KG (DE)

( * ) Notice: Subject to any disclaimer, the term of this patent is extended or adjusted under 35 U.S.C. 154(b) by 0 days.

(21) Appl. No.: 18/538,224

(22) Filed: Dec. 13, 2023

(65) Prior Publication Data

US 2024/0114671 A1    Apr. 4, 2024

Related U.S. Application Data

(62) Division of application No. 17/950,240, filed on Sep. 22, 2022, now Pat. No. 12,028,983.

(30) Foreign Application Priority Data

Sep. 22, 2021  (DE) .................... 10 2021 124 498.6

(51) Int. Cl.
| | |
|---|---|
| *B23P 19/00* | (2006.01) |
| *H05K 3/00* | (2006.01) |
| *H05K 13/00* | (2006.01) |
| *H05K 13/04* | (2006.01) |

(52) U.S. Cl.
CPC ....... *H05K 13/0069* (2013.01); *H05K 3/0008* (2013.01); *H05K 13/04* (2013.01); *H05K 2203/1178* (2013.01)

(58) Field of Classification Search
CPC ........... H05K 13/0061; H05K 13/0069; H05K 13/04; H05K 2203/1178; H01L 21/68742; H01L 21/6875

See application file for complete search history.

(56) References Cited

U.S. PATENT DOCUMENTS

| | | | |
|---|---|---|---|
| 6,870,745 B2 * | 3/2005 | Suhara | H05K 13/0069 361/720 |
| 8,847,178 B2 | 9/2014 | Kawaguchi | |
| 9,607,868 B2 | 3/2017 | Okada | |
| 2011/0000232 A1 | 1/2011 | Yamazaki | |
| 2015/0270146 A1 * | 9/2015 | Yoshihara | H01L 21/67103 134/18 |
| 2021/0221118 A1 | 7/2021 | Falcon et al. | |
| 2022/0208589 A1 * | 6/2022 | Kang | H01L 21/6875 |
| 2023/0039173 A1 * | 2/2023 | Wada | H01L 21/6875 |

FOREIGN PATENT DOCUMENTS

| | | |
|---|---|---|
| DE | 10 2007 028 931 B3 | 2/2009 |
| DE | 11 2012 003 311 T5 | 4/2014 |
| EP | 1796451 A1 | 6/2007 |
| EP | 3851277 A1 | 7/2021 |
| JP | 2016-171 126 A | 9/2016 |
| WO | WO 2013/021594 A1 | 2/2013 |

* cited by examiner

*Primary Examiner* — Paul D Kim
(74) *Attorney, Agent, or Firm* — OSTROLENK FABER LLP

(57) ABSTRACT

The invention relates to a support pin (10) for supporting a substrate (80) in a placement area of a placement machine (100) and a placement machine (100) with at least one placement head (101), a magazine (104) with a plurality of such support pins (10) and a placement board (103).

9 Claims, 2 Drawing Sheets

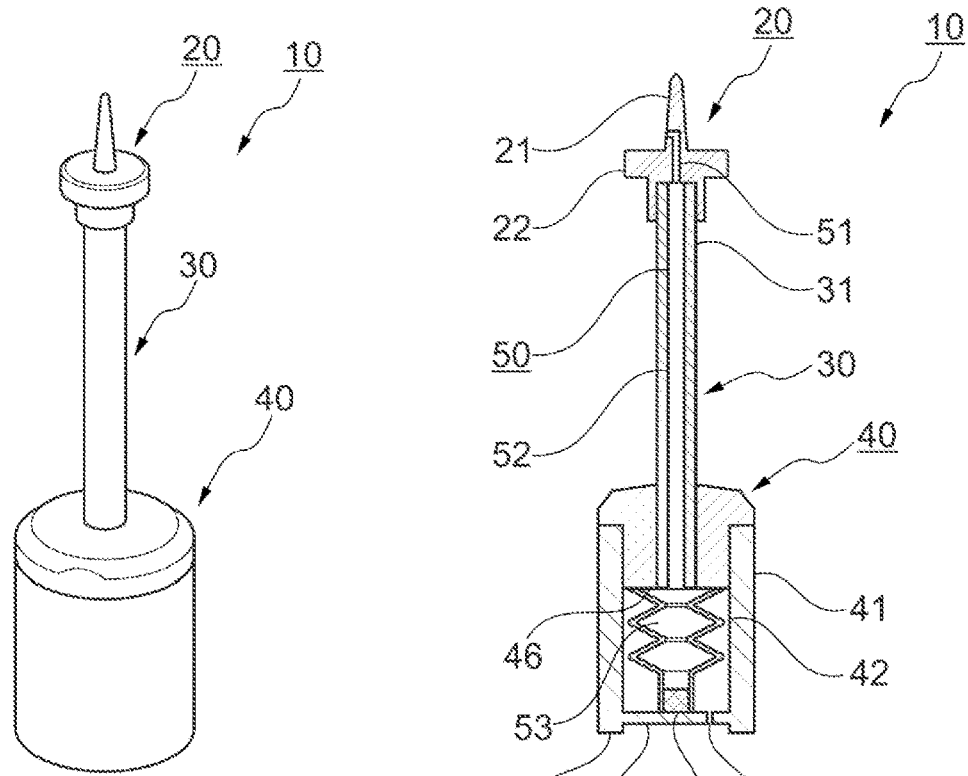

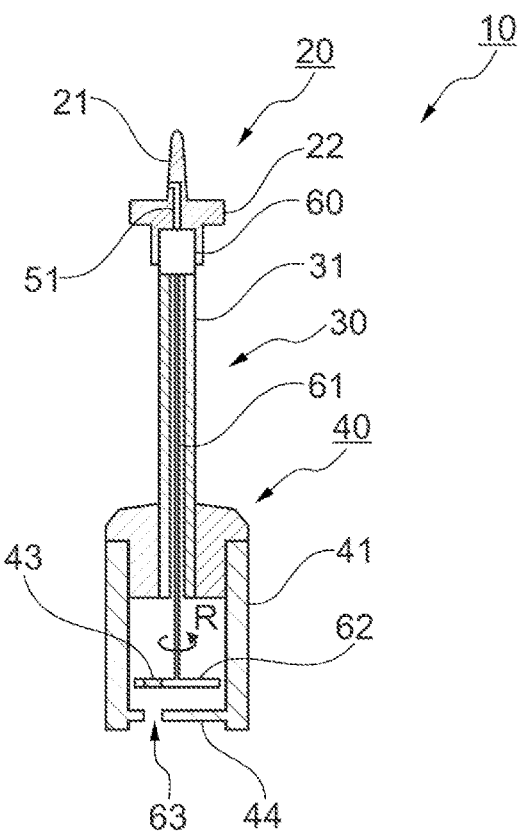
Fig. 4
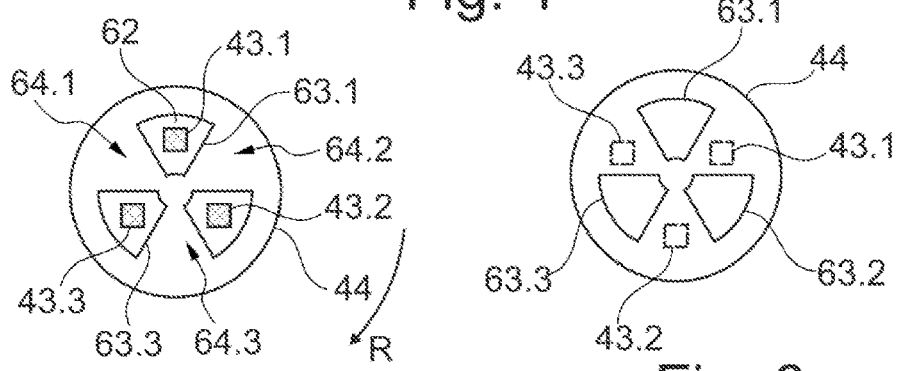
Fig. 5
Fig. 6
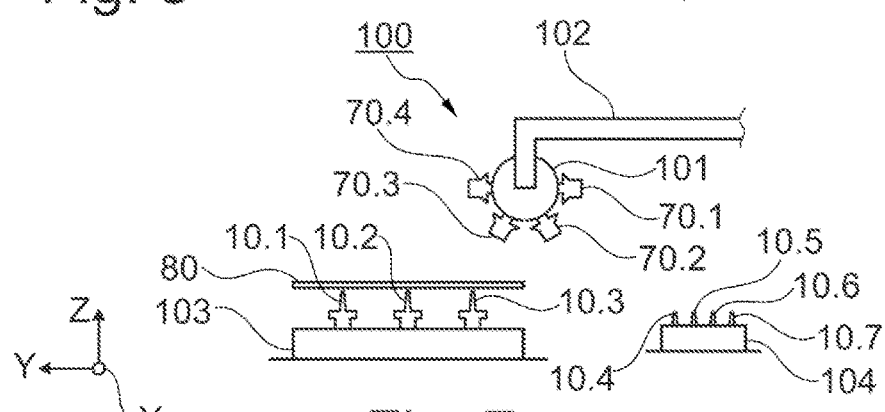
Fig. 7

SUPPORT PIN FOR SUPPORTING A SUBSTRATE IN A PLACEMENT AREA OF A PLACEMENT MACHINE

CROSS REFERENCE OF RELATED PATENT APPLICATION

This is a divisional under 37 C.F.R. § 1.53(b) of prior application Ser. No. 17/950,240, filed Sep. 22, 2022, by Martin NEUSSER and Jetulla AVDILI entitled SUPPORT PIN FOR SUPPORTING A SUBSTRATE IN A PLACEMENT AREA OF A PLACEMENT MACHINE AND PLACEMENT MACHINE, which claims the priority of German Application No. 102021124498.6, filed Sep. 22, 2021, the contents of which are incorporated by reference herein.

DESCRIPTION

The invention relates to a support pin for supporting a substrate in a placement area of a placement machine, and a placement machine having a magazine with a plurality of such support pins.

In placement technology, substrates, mostly printed circuit boards, are fitted with components using placement machines. For this purpose, a placement head of the placement machine that can be moved by a positioning system picks up components from feeders, transfers them to a placement area of the placement machine in which the substrate to be fitted is provided, and deposits the components at predefined placement positions on the substrate. During the assembly process, the substrate is typically fixed laterally at its edge areas.

Since the components are pressed onto the substrate with a certain placement force; for example, in order to stick to a sticky medium (e.g. solder paste, adhesive or flux), the placement head presses the substrate down over the held component. Large substrates in particular tend to sag, which has a negative effect on the positioning accuracy of the components on the substrate and should therefore be avoided. For these reasons, substrate supports are used, in particular for larger substrates. This involves one or more support pins oriented perpendicularly to a substrate plane, which are arranged on a placement board underneath the substrate for placement in order to largely avoid bending of the substrate during the placement process.

DE 11 2012 003 311 T5 discloses a support pin with a lifting chamber and a piston sliding therein. There is a magnetic element on the piston. The piston and thus the magnetic element can be raised and lowered in relation to a lower receiving base part by negative pressure in the lifting chamber, wherein it is possible for the magnetic element to be fixed to the lower receiving base part by a magnetising force. The support pin with the lifting chamber and the piston has a comparatively complex design, is expensive and requires a comparatively large amount of space, so that the support pins have to be dimensioned relatively large.

The object of the invention is to provide an alternative support pin for supporting a substrate in a placement area of a placement machine that does not have the disadvantages of the prior art, and in particular can be constructed simply, inexpensively and with little space requirement.

The object set out above is achieved by the subject matter of the claims. Further advantages and details of the invention emerge from the dependent claims, the description and the drawings. Features and details that are disclosed in connection with the support pins according to the invention naturally also apply in connection with the placement machine according to the invention and vice versa, so that with regard to the disclosure of the individual aspects of the invention, reciprocal reference is or can always be made.

According to a first aspect of the invention, the object is therefore achieved by a support pin for supporting a substrate in a placement area of a placement machine. The support pin has an upper segment, which is designed to support the substrate and to detachably receive the support pin via a placement head of the placement machine. Furthermore, the support pin has a lower segment with at least one permanent magnet for magnetic coupling to a placement board in the placement area. The support pin also has a central segment that extends between the upper segment and the lower segment. And the support pin has a fluid channel that extends along a Z-axis of the support pin within the upper segment, the central segment and the lower segment. The lower segment has a bellows, within which the fluid channel extends and to which the at least one permanent magnet is connected in such a way that the at least one permanent magnet can be moved along the Z-axis between a coupling position and a non-coupling position. The at least one permanent magnet can be magnetically coupled to the placement board in the coupling position and can be magnetically decoupled from the placement board in the non-coupling position when the support pin is provided on the placement board.

Correspondingly, the support pin according to the first aspect of the invention provides bellows that are arranged in the lower segment and connected to the fluid channel in such a way to be compressed and expanded by means of vacuum control. The permanent magnet can also be moved along the Z-axis by means of the bellows, so that a magnetic coupling and decoupling via the placement board is optionally possible. The bellows are a particularly inexpensive and lightweight solution due to the simple manufacture and material, such as an elastomer. The space requirement for such bellows is also comparatively small and the support pin is technically easy to manufacture and design. For example, the coupled and non-coupled positions can be easily adjusted by selecting the number of folds of the bellows and the distance between the folds and the length of the bellows, respectively.

In particular, the bellows can be fastened in the lower segment in such a way that the bellows compress during the transition from the coupling position into the non-coupling position and expand during the transition from the non-coupling position into the coupling position. Alternatively, the compression can also be described as a contraction of the bellows. Alternatively, the expanding can also be described as the bellows being pulled apart.

Furthermore, the fluid channel can be enclosed in a vacuum-tight manner by the bellows. In other words, the fluid channel can be sealed by the bellows. The sealing can take place in particular with respect to a housing wall within the lower segment. This avoids a loss of negative pressure and ensures that a negative pressure conveyed from the upper segment can develop fully on the lower segment and thus on the bellows in order to move the at least one permanent magnet accordingly.

The at least one permanent magnet can in particular be attached to an end of the bellows close to an underside of the lower segment. The end near the underside is further from the upper segment than an end of the bellows remote from the underside or opposite to the underside, wherein the two ends move towards one other when the bellows are compressed and away from one other when the bellows are expanded. Due to the fact that the at least one permanent magnet is located close to the underside of the lower segment, a simple magnetic coupling and decoupling from the placement board can be guaranteed, which insofar comes into close range or contact with the underside when the support pin is placed on the placement board or in reached their vicinity.

The at least one permanent magnet can be attached to the bellows in a materially bonded and/or form-fitting manner. For example, the at least one permanent magnet can be glued to the bellows. Alternatively or additionally, the at least one permanent magnet can be accommodated, for example, in a section corresponding to its geometry, in particular a pocket, of the bellows, which can be arranged at the end near the underside of the lower segment for this purpose. The materially bonded and form-fitting fastening can be produced particularly easily and reliably.

At least one ventilation hole can be formed in a base of the lower segment. The underside of the lower segment may be formed on the base of the lower segment. The space or volume between the bellows and the base of the lower segment can be ventilated through the ventilation hole in order to allow unhindered expansion or expanding and contraction or compression of the bellows.

According to a second aspect of the invention, the object set out at the outset is achieved by a further support pin for supporting a substrate in a placement area of a placement machine. This further support pin also has an upper segment, which is designed to support the substrate and to detachably receive the support pin via a placement head of the placement machine. This support pin also has a lower segment with at least one permanent magnet for magnetic coupling to a placement board in the placement area. Furthermore, this support segment also has a central segment that extends between the upper segment and the lower segment. In this support pin, the at least one permanent magnet can be rotated relative to a base of the lower segment by means of a rotating spindle of the support pin, wherein the base has at least one coupling area and at least one non-coupling area, so that the at least one permanent magnet is movable by means of rotation relative to the base between a coupling position in which the at least one permanent magnet faces the at least one coupling portion, and a non-coupling position in which the at least one permanent magnet faces the at least one non-coupling portion. The at least one permanent magnet can thus be magnetically coupled to the placement board in the coupling position and can be magnetically decoupled from the placement board in the non-coupling position when the support pin is provided on the placement board.

Correspondingly, according to the second aspect of the invention, the support pin provides a rotating spindle which enables rotation of the at least one permanent magnet relative to a base for magnetic coupling and decoupling with the placement board. Due to its simple functional principle, the rotating spindle is a particularly inexpensive and lightweight solution. The space requirement for such a rotating spindle and the corresponding base is also comparatively small because the rotating spindle can be integrated within the already existing elongate structure of the support pin and the existing base can easily be equipped with the coupling and non-coupling area. As a result, the support pin is technically easy to manufacture and design.

In particular, the at least one coupling area can be formed by a magnetisable material and the at least one non-coupling area can be formed by a non-magnetisable material. Correspondingly, a magnetic coupling or reinforcement between the at least one permanent magnet and the coupling area can take place via the magnetisable material and a magnetic decoupling or weakening between the at least one permanent magnet and the non-coupling area can take place via the non-magnetisable material.

The at least one non-coupling area can be formed by a recess in the base. This is a particularly simple way of providing the at least one non-coupling area. In this case, the non-coupling area is formed by air as a non-magnetisable material or the air space within the recess. Alternatively, the base can consist of a material mix in which the non-coupling area can be made of a non-magnetisable material, such as a plastic, and the coupling area can be made of a magnetisable material.

It is also possible that the base has at least two or at least three coupling areas and at least two or at least three non-coupling areas. The number of permanent magnets can correspond to the number of coupling areas and/or non-coupling areas. Correspondingly, for example, at least two or at least three permanent magnets can be attached to the rotating spindle. These can be arranged, for example, on a plate or a rotating board, which can be rotated relative to the base by means of the rotating spindle.

The coupling areas can be formed symmetrically to one another. Alternatively or additionally to this, the non-coupling areas can be formed symmetrically to one another. Compared to a coupling area and non-coupling area as well as an asymmetrical arrangement respectively, the symmetrical design with several coupling and non-coupling areas as well as several permanent magnets advantageously allows the support pin to stand on the base surface of the support pin or base and is therefore particularly secure, conveyed by the magnetic force of the permanent magnets placement board.

The support pin may have a rotating device coupled to the rotating spindle and connected to a fluid channel of the support pin extending in the upper segment. The rotating device can be configured to rotate the rotating spindle relative to the base by generating a vacuum or supplying compressed air in the fluid channel. Such a rotating device allows the rotating spindle to be rotated in a particularly simple manner by generating a vacuum or supplying compressed air, which can be conveyed by the placement head. Typically, the placement head already has a vacuum generation device and/or compressed air supply device, which can be used for this purpose in a simple manner. The fluid channel can be fluidically connected to the placement head to allow the described mechanism of rotation of the rotating spindle.

The lower segment can be designed as a housing enclosing the at least one permanent magnet. As a result, at least part of the mechanism for moving the permanent magnet, either in the Z-direction according to the first aspect of the invention or twisting or rotating relative to the base, can be safely and securely located in the housing. In particular, the housing can enclose the at least one permanent magnet on all sides or almost on all sides, with the exception of the base, in which the already mentioned at least one ventilation hole can be provided.

The housing can thus be designed as a stand. This enables the support pin to be set down safely and stably on the placement board. The base can be formed by corresponding feet protruding from the base of the lower segment or housing. The feet can run or be arranged on an edge or perimeter of the base. For example, two or more feet can be provided that are separated from one another by interruptions. The feet can in particular be formed by a peripheral wall, in particular an interrupted one, on the periphery of the base.

According to a third aspect of the invention, the object mentioned at the outset is also achieved by a placement machine with at least one placement head, a magazine with a plurality of support pins according to the first aspect of the invention and/or according to the second aspect of the invention and a placement board. The at least one placement head can be moved between the magazine and the placement board, and the at least one placement head is designed to remove the support pins from the magazine and place them on the placement board.

Conversely, the placement head can of course also be used to pick up the support pins from the placement board and return them to the magazine, in particular to set them down there. As already mentioned, the placement head can in turn have a vacuum generating device and/or a compressed air supply device which is fluidically connected to the fluid channel in the support pin when the placement head receives the support pin.

The support pin can be accommodated on the placement head by corresponding segments or placement segments on the placement head, which are typically also referred to as pipettes. The pipettes in turn have fluid channels which can then be connected to those of the support pins to aspirate the support pins. Additionally or alternatively, the pipettes may have mechanical gripping means for mechanically gripping and thereby picking up the support pins. A placement head can in principle have a plurality of such segments or pipettes, which can be used not only for receiving the support pins, but also for the subsequent placement of the substrate with the components, in that they receive the components and set them down on the substrate after the substrate has been placed on the support pins once placed at the desired positions on the placement board.

The invention according to the exemplary embodiments is explained in more detail below with reference to the enclosed drawings. All of the features arising from the claims, the description or the figure, including structural details, can be essential to the invention both individually and in any of various combinations. In the figures.

BRIEF DESCRIPTION OF THE DRAWING(S)

FIG. 1 shows a schematic representation of a support pin according to two exemplary embodiments, FIG. 2 shows a cross-sectional view through the support pin from FIG. 1, wherein the support pin is designed according to a first exemplary embodiment and is in a coupling position, FIG. 3 shows a cross-sectional view of the support pin of FIG. 2 being gripped by a pipette of a placement head, wherein the support pin is in a non-coupling position, FIG. 4 shows a cross-sectional view through the support pin from FIG. 1, wherein the support pin is designed according to a second exemplary embodiment and is in a non-coupling position, FIG. 5 shows a cross-sectional view through the base of the support pin from FIG. 4, wherein the support pin is in the non-coupling position, FIG. 6 shows the cross-sectional view through the base of the support pin from FIG. 5 with the difference that the support pin is in the coupling position, FIG. 7 shows a schematic representation of a placement machine with a magazine of support pins from FIG. 1.

Elements with the same function and mode of operation are each provided with the same reference signs in FIGS. 1 to 7. Insofar as such an identical element is shown more than once in one of FIGS. 1 to 7, it is likewise provided with the same reference sign but is numbered consecutively in order to ensure that it can be distinguished from the other identical elements. The sequential numbering is separated from the reference number by a point.

FIG. 1 shows a support pin 10 as can be used in the placement area of a placement machine 100 (see FIG. 7) to support a substrate 80 (see FIG. 7), such as a printed circuit board 80, on which components are to be placed. The support pin 10 has an upper segment 20 in an upper area and a lower segment 40 opposite the upper segment 20 in the lower area. Between the upper segment 20 and the lower segment 40 there is a central segment 30, which in the present case is designed as a shaft 31 or is shaft-shaped.

FIG. 2 shows a view into the interior of the support pin 10 according to a first embodiment. The upper segment 20 has a support area 21, which in the present case has a pointed shape in order to support the substrate 80 together with further support pins 10 at a predetermined position on a placement board 103 (see FIG. 7) and at predetermined positions on the substrate 80. Furthermore, the upper segment 20 has an optional gripping area 22, which can be gripped by a corresponding pipette 70 (see FIGS. 3, 7) in order to transport the support pin 10 to the placement board 103 by means of a placement head 101 (see FIG. 7).

The lower segment 40 of the support pin 10 is formed as a housing 41 with feet 47 located on an underside thereof. As a result, the housing 41 is designed as a kind of stand 41 so that the support pin 10 can be placed stably on the placement board 103. In this first exemplary embodiment, in the lower segment 40 there are bellows 42 on which a permanent magnet 43 is arranged, in particular fastened in a materially bonded and/or form-fitting manner. The bellows 42 are arranged on an inner side 46 in the lower segment 40 and seal off a fluid channel 50 of the support pin 10 there.

The fluid channel 50 extends with a first fluid section 51 in the upper segment 20 via a second fluid section 52 in the central segment 30 to a third fluid section 53 in the lower segment 40. The third fluid section 53 is formed by the space or the volume that the bellows 42 encloses. The third fluid section 53 is designed to be compressible and expandable by compressing and expanding the bellows 42.

The first fluid section 51 or the fluid channel 50 can be coupled at its upper segment 20 to a fluid chamber 71 of the pipette 70, as shown in FIG. 3. In the position of the permanent magnet 43 shown in FIG. 2, the permanent magnet 43 or the support pin 10 assumes a coupling position. If the support pin 10 is or will be set up on a magnetic or magnetisable placement board 103 in the placement area of the placement machine 100, then the permanent magnet 43 magnetically couples the support pin 10 to the placement board 103. This establishes the coupling position of the support pin 10, as can also be seen in FIG. 7 for the support pins 10.1, 10.2, 10.3. In the coupling position, the permanent magnet 43 is located on or near the base 44, which is provided with a ventilation hole 45, on the underside of the lower segment 40, which faces the placement board 103.

In FIG. 3, the already mentioned pipette 70 or the segment that is located on the placement head 101 is shown as it grips the gripping section 22 of the support section 10 and is fluidically coupled with its fluid chamber 71 to the fluid channel 50 on the upper segment 20 of the support pin 10. A negative pressure conveyed by the placement head 101 via the pipette 70 in the fluid chamber 71 creates a corresponding negative pressure or suction in the fluid channel 50, which, compared to the coupling position from FIG. 2, compresses the bellows 42 along the Z-axis shown, along which the support pin 10 extends longitudinally. The compression of the bellows 42 causes a displacement or movement of the permanent magnet 43 arranged thereon in the direction of the Z-axis and thus a magnetic decoupling from the placement board 103 located underneath or from the magazine 104 (see FIG. 7), in which the support pins 10 are stored, and can be magnetically coupled in the same way. This generation of negative pressure in the fluid channel 50 allows the support pin 10, which is otherwise placed on the placement board 103 or in the magazine 104, to be picked up or lifted in a defined manner, since the magnetic holding force between the permanent magnet 43 and the placement board 103 or the magazine 104 can no longer be exerted by the placement head 101 or the pipette 70 must be overcome.

Conversely, if the support pin 10 is to be held securely in a predefined position on the placement board 103, the coupling position can be established by placing the support pin 10 by means of the pipette 70 at the predefined position and interrupting the generation of negative pressure or not providing a negative pressure, whereby the support pin 10 is held magnetically on the placement board 103 by means of its permanent magnet 43.

FIG. 4 shows an alternative embodiment compared to the first embodiment of a support pin 10 or the mechanism for magnetic coupling and decoupling of one or, in this case, a plurality of permanent magnets 43.1, 43.2, 43.3 (see FIG. 5) with a placement board 103 or a magazine 104.

For this purpose, the second exemplary embodiment of the support pin 10 has a rotating mechanism formed by a rotating device 60 and a rotating spindle 61. The rotating device 60 is shown in the upper segment 20 in the present case, but can also, alternatively or additionally, be located in the central segment 30 or lower segment 40. The rotating device 60 can be fluidically coupled to the pipette 70 (see FIG. 3) by means of a fluid channel 50, in particular a fluid section 51. From the pipette 70 a negative pressure can again be provided, which is converted by the rotating device 60 into a rotation in the direction of rotation R of the rotating spindle 61. Alternatively, compressed air can be supplied by the pipette 70 from the fluid channel 50 and thus to the rotating device 60. In such a case, the rotating device 60 can be configured to implement a rotation of the rotating spindle 61 by the supplied compressed air. The rotating spindle 61 can, in particular together with the rotating device 60, also be referred to as a cylinder, in particular a pneumatic cylinder.

A rotating board 62 is located in the lower segment 40 at one end of the rotating spindle 61. In the present case, three permanent magnets 43.1, 43.2, 43.3 arranged symmetrically to one another are fastened to this (see FIG. 5). These can be rotated relative to the base 44 of the lower segment 40 by the rotation R imparted by the rotating spindle 61. The base has the coupling areas 63.1, 63.2, 63.3 and non-coupling areas 64.1, 64.2, 64.3, which can be seen particularly clearly in FIG. 5 and which are also arranged symmetrically over the base 44.

FIG. 5 now shows a non-coupling position of the support pin 10 with a placement board 103 or a magazine 104. The section shown in FIG. 5 goes through the base 44 and provides a view of the rotating board 62 lying above it with the permanent magnets 43.1, 43.2, 43.3. The permanent magnets 43.1, 43.2, 43.3 arranged on the rotating board 62 are located opposite the non-coupling areas 63.1, 63.2, 63.3, which are formed here by recesses 63.1, 63.2, 63.3 in the base 44 or the base plate of the lower segment 40. The air in the recesses 63.1, 63.2, 63.3 ensures a considerable weakening of the magnetic field between the permanent magnets 43.1, 43.2, 43.3 and a magnetic component plate 103, so that there is no or at most only a very small magnetic coupling, which can be understood as no magnetic coupling or non-coupling position.

If the rotating board 62 is now rotated in the direction of rotation R relative to the base 44 by the compressed air or the negative pressure from the pipette 70, the permanent magnets 43.1, 43.2, 43.3 attached thereto can also be moved away from the non-coupling areas 63.1, 63.2, 63.3 or are brought into one position in which the permanent magnets 43.1, 43.2, 43.3 face the magnetic coupling areas 64.1, 64.2, 64.3 between the non-coupling areas 63.1, 63.2, 63.3. In the present case, the coupling areas 64.1, 64.2, 64.3 are formed by a correspondingly magnetisable material of the base 44; for example, a ferrite. As a result, the magnetic field between the permanent magnets 43.1, 43.2, 43.3 and the placement board 103 is strengthened and a magnetic coupling is produced, so that there is a magnetic coupling position here.

FIG. 7 basically shows an exemplary embodiment of a placement machine 100 that can make use of one or both exemplary embodiments of the support pins 10. The support pins 10, in this case the support pins 10.4, 10.5, 10.6, 10.7, are essentially located in a corresponding magazine 104, where they can be magnetically coupled in order to be located at a defined location.

In order to be able to populate a substrate 80 with components using a placement head 101 with a placement arm 102 or a robot arm, the substrate 80 must be held in a defined position. For this purpose, in FIG. 7 the placement head 101 has removed the support pins 10.1, 10.2, 10.3 from the magazine 104 by means of suitable pipettes 70.1, 70.2, 70.3, 70.4, for which purpose it has created a non-coupling position by means of the mechanisms of vacuum generation and/or compressed air supply described above in the support pins 10.1, 10.2, 10.3. The placement head 101 has then set the support pins 10.1, 10.2, 10.3 at positions defined for the substrate 80 on the placement board 103, which can in particular be a magnetic or magnetisable lifting table board. By setting up and removing the pipettes 70.1, 70.2, 70.3, 70.4, the support pins 10.1, 10.2, 10.3 are automatically transferred from the non-coupling position to the coupling position and can thus be held magnetically and thus stand securely on the placement board 103. The substrate 80 was then placed on the support pins 10.1, 10.2, 10.3. The placement process of placing the substrate 80 or the printed circuit board 80 with components from one or more other magazines (not shown) can now take place. After the placement process, the support pins 10.1, 10.2, 10.3 can be picked up again by the pipettes 70.1, 70.2, 70.3, 70.4 and placed in the magazine 104.

LIST OF REFERENCE SIGNS

10 Support pin
20 Upper segment
21 Support area
22 Gripping area
30 Central segment
31 Shaft
40 Lower segment
41 Housing, stand
42 Bellows
43 Permanent magnet
44 Base, underside 45 Ventilation hole
46 Inner side
47 Foot
50 Fluid channel
51 First fluid section
52 Second fluid section
53 Third fluid section
60 Rotating device
61 Rotating spindle
62 Rotating board
63 Non-coupling area, recess
64 Coupling area
70 Pipette
71 Fluid space
80 Substrate, printed circuit board
100 Placement machine
101 Placement head
102 Placement arm
103 Placement board
104 Magazine
R Direction of rotation

What is claimed is:

1. A support pin for supporting a substrate in a placement area of a placement machine, comprising an upper segment designed to support the substrate and to releasably receive the support pin via a placement head of the placement machine; a lower segment having at least one permanent magnet for magnetically coupling with a placement board in the placement area; and a central segment extending between the upper segment and the lower segment, wherein the at least one permanent magnet can be rotated with respect to a base of the lower segment by means of a rotating spindle of the support pin, wherein the base has at least one coupling area and at least one non-coupling area, such that the at least one permanent magnet is movable by means of rotation relative to the base between a coupling position, in which the at least one permanent magnet faces the at least one coupling area, and a non-coupling position, in which the at least one permanent magnet faces the at least one non-coupling area, and wherein the at least one permanent magnet is magnetically couplable to the placement board in the coupling position and is not magnetically couplable with the placement board in the non-coupling position when the support pin is provided on the placement board.

2. The support pin according to claim 1, wherein the at least one coupling area is formed by a magnetisable material and the at least one non-coupling area is formed by a non-magnetisable material.

3. The support pin according to claim 1, wherein the at least one non-coupling area is formed by a recess in the base.

4. The support pin according to claim 1, wherein the base has at least two or at least three coupling areas and at least two or at least three non-coupling areas.

5. The support pin according to claim 4, wherein the coupling areas are formed to have rotational symmetry about the rotating spindle and/or the non-coupling areas are formed to have rotational symmetry about the rotating spindle.

6. The support pin according to claim 1, further comprising a rotating device coupled to the rotating spindle and connected to a fluid channel of the support pin extending in the upper segment which is configured to rotate the rotating spindle relative to the base by generating a vacuum or supplying compressed air in the fluid channel.

7. The support pin according to claim 1, wherein the lower segment is designed as a housing enclosing the at least one permanent magnet.

8. The support pin according to claim 7, wherein the housing is designed as a stand.

9. A placement machine comprising: at least one placement head; a magazine with a plurality of support pins according to claim 1; and a placement board, wherein the at least one placement head is movable between the magazine and the placement board, and wherein the at least one placement head is designed to remove the support pins from the magazine and configure the support pins on the placement board.

* * * * *